(12) United States Patent
Sato (10) Patent No.: US 7,190,627 B2
(45) Date of Patent: Mar. 13, 2007

(54) SEMICONDUCTOR DEVICE

(75) Inventor: Takahiko Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 72 days.

(21) Appl. No.: 10/833,128

(22) Filed: Apr. 28, 2004

(65) Prior Publication Data
US 2005/0099756 A1 May 12, 2005

(30) Foreign Application Priority Data
Nov. 7, 2003 (JP) .............................. 2003-378325

(51) Int. Cl.
*G11C 7/00* (2006.01)
(52) U.S. Cl. ........................ 365/222; 365/194; 365/233
(58) Field of Classification Search ................ 365/222, 365/194, 233
See application file for complete search history.

(56) References Cited

U.S. PATENT DOCUMENTS 4,542,454 A * 9/1985 Brcich et al. ............... 365/222
5,825,706 A * 10/1998 Snowden et al. ........... 365/222
6,545,311 B2 * 4/2003 Shukuri et al. ............. 257/314
2004/0120204 A1 * 6/2004 Kanda et al. ............ 365/225.7

FOREIGN PATENT DOCUMENTS

JP      2003168292 A     6/2003

* cited by examiner

*Primary Examiner*—David Lam
(74) *Attorney, Agent, or Firm*—Arent Fox PLLC (57) ABSTRACT

A semiconductor device having a logic circuit, a delay circuit, and a processing circuit, wherein the logic circuit performs a logical operation process and outputs a first signal, the delay circuit delays an input signal and outputs a second signal, in parallel with the logical operation process of the logic circuit, and the processing circuit inputs the first signal and the second signal, and starts a process when both the first signal and the second signal are outputted.

17 Claims, 10 Drawing Sheets

SEMICONDUCTOR DEVICE

CROSS-REFERENCE TO RELATED APPLICATIONS

This application is based upon and claims the benefit of priority from the prior Japanese Patent Application No. 2003-378325, filed on Nov. 7, 2003, the entire contents of which are incorporated herein by reference.

BACKGROUND OF THE INVENTION

1. Field of the Invention

The present invention relates to a semiconductor device, especially having a logic circuit and a delay circuit.

2. Description of the Related Art

Inside of a semiconductor circuit, desired functions can be achieved by successive operations that are a logical operation process in a logic circuit for several signals, and after that, a timing adjustment in a delay circuit and an output of signals to a next processing portion. Hereby, the logic circuit frequently gives priority to one of the requests described below.

Fast operation

Low electric current consumption

A space saving

In addition, the logic circuit is largely influenced by dispersions of processing time caused by the dispersions described below.

An element parameter dispersion

A power-supply voltage dispersion

A temperature dispersion

Especially in recent years, operation voltage becomes low voltage and comes to be used in a region near a threshold voltage of a transistor, so dispersions tends to be larger than before.

On the contrary, the delay circuit is designed to give priority to the request of the following (4) than the requests of the following (1) to (3), so dispersions depending on each condition are smaller than the logic circuit which performs the logical operation process of signals.

(1) Fast operation
(2) Low electric current consumption
(3) A space saving
(4) An accuracy of time measurement Functions as a semiconductor circuit are achieved by the combination of the logical operation process of the logic circuit and the delaying operation of the delay circuit. However, dispersions of the processing time when these circuits are connected in series are averaged by the percentage of time which is occupied by these circuits during the operation period. So, the dispersions become large compared to the case when every circuit are composed of only the delay circuits. This becomes more pronounced when the processing time for one logical operation process becomes large by the low voltage.

Besides, in a process which combines plural signals, if an arriving order of each signal is reversed, it may cause a malfunction. The reverse of the arriving order of signals is easy to occur when the effect of various dispersions become large, because the percentage of the logical operation time and the delaying time are different in each path.

A synchronous semiconductor memory device to improve dispersion of timing is described in the patent document Japanese Patent Application Laid-open No. 2003-168292.

SUMMARY OF THE INVENTION

An object of the present invention is to provide a semiconductor device which can control dispersions of processing time depending on respective conditions.

A semiconductor device having a logic circuit, a delay circuit, and a processing circuit is provided from one point a view of the present invention. The logic circuit performs a logical operation process and outputs a first signal. The delay circuit delays an input signal and outputs a second signal in parallel with the logical operation process of the logic circuit. The processing circuit inputs the first signal and the second signal, and starts a process when both the first signal and the second signal are outputted.

DETAILED DESCRIPTION OF THE PREFERRED EMBODIMENTS

First Embodiment

Figure 1:
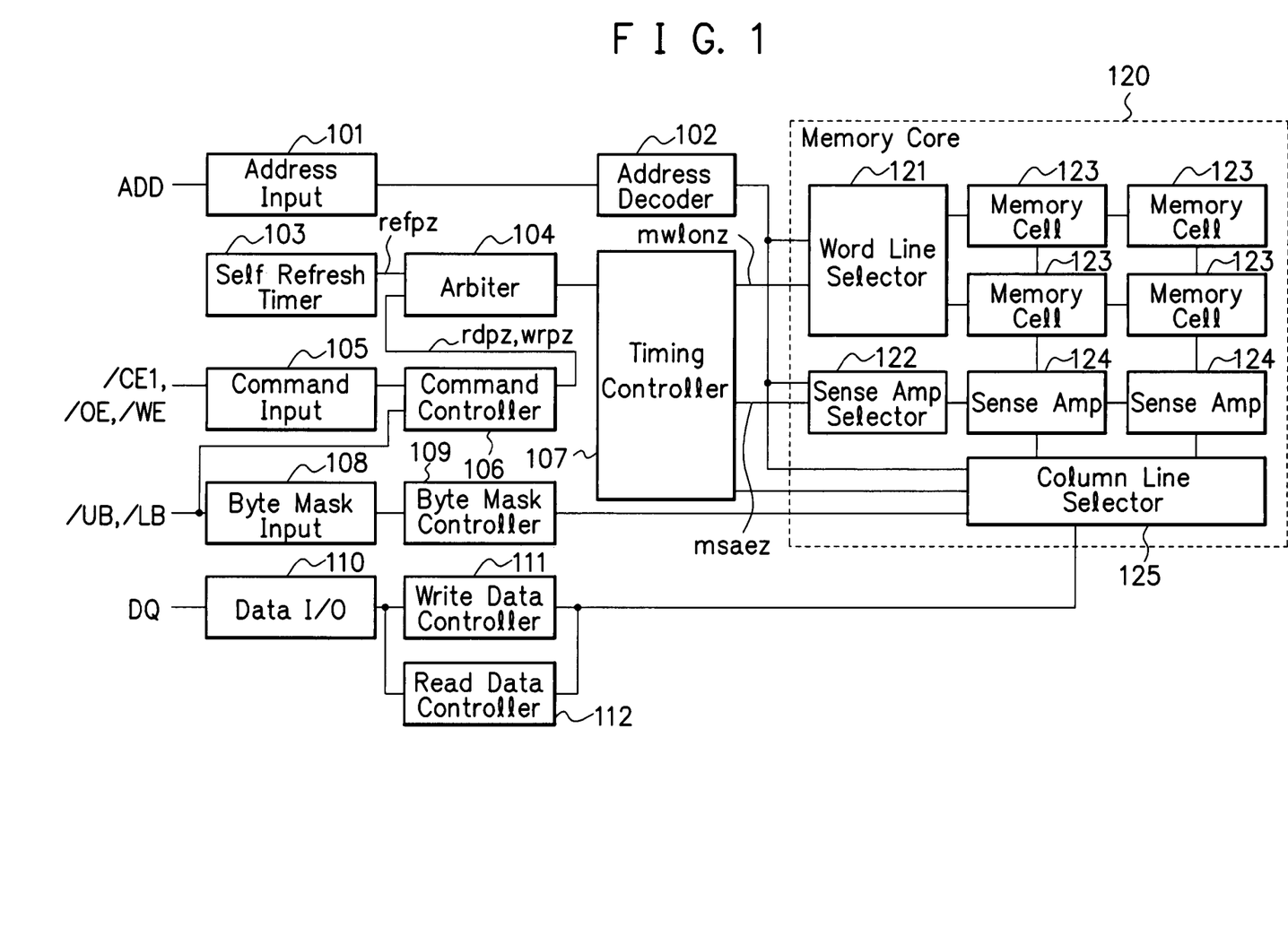
FIG. 1 is a block diagram which shows a configuration example of a semiconductor memory device of a first embodiment according to the present invention.

FIG. 1 is a block diagram which shows a configuration example of a semiconductor memory device of a first embodiment according to the present invention. A memory core 120 has a word line selector 121, a sense amp selector 122, a memory cell 123, a sense amp 124, and a column line selector 125.

An address ADD is supplied to an address decoder 102 through an address input circuit 101. The address decoder 102 decodes, on the basis of the address ADD, and outputs control signals to selectors 121, 122, and 125.

A self refresh timer 103 regularly outputs a refresh command refpz to an arbiter 104. A chip enable signal /CE1, an output enable signal /OE, and a write enable signal /WE are supplied to a command controller 106 through a command input circuit 105. An upper byte signal /UB enables the upper byte, and a lower byte signal /LB enables the lower byte, and both are mask signals. The command controller 106 outputs a read command rdpz or a write command wrpz to the arbiter 104, based on the signals /CE1, /OE, /WE, /UB, /LB.

The read command rdpz is a command to read data out of the memory cell 123. The write command wrpz is a command to write data to the memory cell 123. The refresh command refpz is a command to refresh the memory cell 123.

"Refresh" is an operation to supply electric charge to avoid memory loss of a DRAM. The DRAM is a kind of semiconductor memory device, which has a capacitor in the memory cell 123 and keeps data by storing electrical charge in the capacitor. This electrical charge will decrease with time, discharge completely in a given time, and lose information. To prevent this memory loss, the DRAM requires being supplied electrical charge at a regular time intervals by the refresh operation.

During refreshing, it is impossible to read and write. On the contrary, during reading or writing, it is impossible to refresh. Therefore, when the read command rdpz or the write command wrpz is generated while refreshing, the read or write operation will be queued. On the contrary, when the refresh command refpz is generated while reading or writing, the refresh operation will be queued. The arbiter 104 outputs the refresh command refpz, the read command rdpz, and the write command wrpz, to a timing controller 107 in chronological order.

The timing controller 107 outputs control signals mwlonz, msaez, and so on, to the word line selector 121, the sense amp selector 122, and the column line selector 125, in accordance with the refresh command refpz, the read command rdpz, and the write command wrpz. The control signal mwlonz will be supplied to the word line selector 121, and the control signal msaez will be supplied to the sense amp selector 122. The details of the timing controller 107 will be described later referring to FIG. 4 to FIG. 8.

The upper byte signal /UB and the lower byte signal /LB will be supplied to a byte mask controller 109 through a byte mask input circuit 108. The byte mask controller 109 outputs control signals to the column line selector 125 in accordance with the signals.

The memory cells 123 which are two dimensionally aligned are specified by word lines and column lines. The word line selector 121 selects and activates the word line in accordance with the control signal. The column line selector 125 selects the column line in accordance with the control signal. When the write command wrpz is generated, the data can be written (memorized) to the specified memory cell 123. When the read command rdpz is generated, the data can be read out of the specified memory cell 123. The memory cells 123 are data accessed in accordance with the read command rdpz or the write command wrpz. The sense amp selector 122 activates the sense amps 124 in accordance with control signals. The sense amp 124 amplifies the signal (data) on a bit line of the memory cell 123.

When the read command rdpz is generated, a read data controller 112 reads data out of the memory cell 123 through the column line selector 125, and outputs a data DQ through a data I/O circuit 110 to the outside.

When the write command wrpz is generated, a write data controller 111 inputs the data DQ through the data I/O circuit 110, and writes the data to the memory cell 123 through the column line selector 125.

Figure 2A:
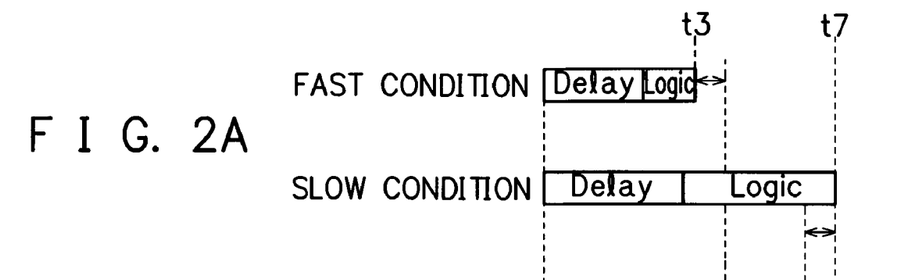
FIG. 2A and FIG. 2B are views which show dispersions of processing time of the semiconductor device using a logic circuit and a delay circuit.
Figure 2B:
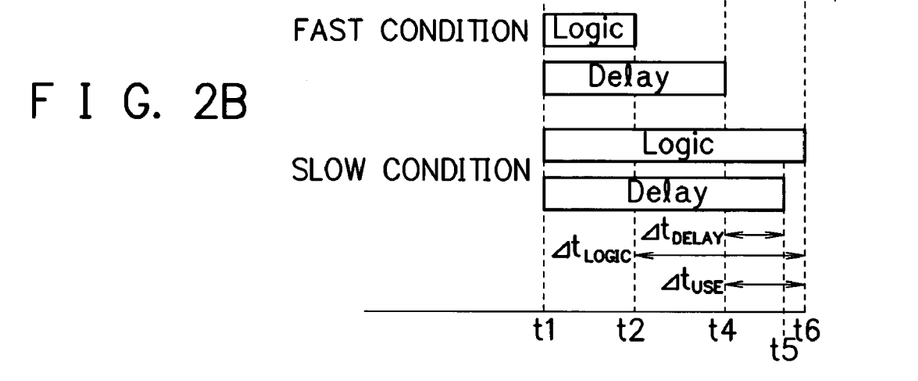

FIG. 2A and FIG. 2B show dispersions of the processing time of the semiconductor device using the logic circuit and the delay circuit. The logic circuit performs a logical operation process and outputs a signal. The delay circuit delays an input signal and outputs the signal.

The logic circuit gives priority to requests of a fast operation, a low electric current consumption, and a space saving. Therefore, it is largely influenced by the dispersions of the processing time caused by the dispersions such as an element parameter dispersion, a power-supply voltage dispersion, and a temperature dispersion, and so on. On the contrary, the delay circuit is designed to give priority to the request which is accurate on time measurement than the requests of the fast operation, the low electric current consumption, and the space saving. So, the delay circuit has smaller dispersion by each condition than the logic circuit in which the logical operation processes of signals are performed.

In other words, the delay circuit has smaller dispersion of the processing time depending on conditions than the logic circuit. From the above mentioned feature, the delay circuit has resistance and/or capacity, and the logic circuit has neither resistance nor capacity. However, both the delay circuit and the logic circuit have transistors. The delay circuit has a MOS field-effect transistor of which gate length is 0.2 μm or more (preferably 0.5 μm or more), and the logic circuit has a MOS field-effect transistor of which gate length is less than 0.2 μm. By using the transistor with long gate length, the delay circuit can have small dispersion of the processing time because the influence of the processing accuracy as-manufactured is small. The logic circuit uses the transistor with short gate length, and can have a high degree of integration and achieves the space saving and so on.

FIG. 2A shows the dispersions of the processing time of the semiconductor device as an example which uses the logic circuit and the delay circuit. The delay circuit and the logic circuit are connected in series, and after the delaying process Delay is performed in the delay circuit, the logical operation process Logic is performed in the logic circuit. The semiconductor device achieves desired functions by the series of operations that is the timing adjustment for several signals in the delay circuit, and after that, the logical operation process and the output of signals to the next processing portion in the logic circuit. As above mentioned, either a fast condition which operates in fast or a slow condition which operates in slow is determined by the condition which is changed by the element parameter dispersion, the power-supply voltage dispersion, and the temperature dispersion, and so on.

Under the fast condition, the delaying process Delay starts at the time t1, and when the process ends, the logical operation process Logic starts and ends at the time t3. Under the slow condition, the delaying process Delay starts at the time t1, and when the process ends, the logical operation process Logic starts and ends at the time t7. Under the slow condition, both the delaying process Delay and the logical operation process Logic take long time compared to the fast condition. However, between the fast condition and the slow condition, the time dispersion of the delaying process Delay is smaller than that of the logical operation process Logic.

Under the fast condition, the process ends at the time t3, and under the slow condition, the process ends at the time t7. If the specified value ΔtUSE of the end time is between t4 and t6, the end time t3 of the fast condition is too early and the end time t7 of the slow condition is too late.

FIG. 2B shows the dispersions of the processing time of the semiconductor device which uses the logic circuit and the delay circuit in this embodiment. The delay circuit and the logic circuit are connected in parallel, and the delaying process Delay in the delay circuit and the logical operation process Logic in the logic circuit run in parallel.

Under the fast condition, the logical operation process Logic starts at the time t1 and ends at the time t2, and the delaying process Delay starts at the time t1 and ends at the time t4. Under the slow condition, the logical operation process Logic starts at the time t1 and ends at the time t6, and the delaying process Delay starts at the time t1 and ends at the time t5. Under the slow condition, both the delaying process Delay and the logical operation process Logic take long time compared to the fast condition. However between the fast condition and the slow condition, the time dispersion ΔtDELAY of the delaying process Delay is smaller than the time dispersion ΔtLOGIC of the logical operation process Logic.

Under the fast condition, the process ends at the time t4 and the next process starts, and under the slow condition, the process ends at the time t6 and the next process starts. Which is to say, at the time when both the logic process Logic and the delaying process Delay end, the next process starts. If the specified value ΔtUSE of the end time is between t4 and t6, both the end time t4 of the fast condition and the end time t6 of the slow condition fall in the specified value ΔtUSE. Concretely speaking, under the fast condition, the end time t4 of the delaying process Delay is set at the earliest time t4 of the specified value ΔtUSE. By setting the delaying process time, the end time under the fast condition is prevented from being earlier than the earliest time t4 of the specified value ΔtUSE. Under the slow condition, the end time t6 of the logical operation process Logic is set at the latest time t6 of the specified value ΔtUSE. By this setting, the end time under the slow condition is prevented from being later than the latest time t6 of the specified value ΔtUSE. Besides, under the slow condition, the end time t6 of the logical operation process Logic is the start timing of the next process, then the latest time t6 of the specified value ΔtUSE can be as early as possible.

Figure 3A:
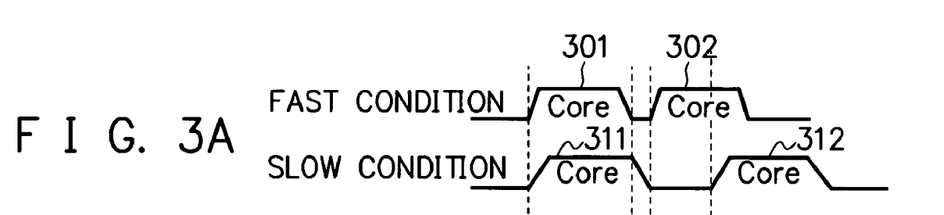
FIG. 3A to FIG. 3C are views which show control methods of deactivation periods of word lines.

FIG. 3A corresponds to FIG. 2A, and shows a control method of deactivation periods of the word line as an example. Under the fast condition, after a first process (for example a refresh operation) 301 ended, a second process (for example a read operation) 302 is performed. During the processes 301 and 302, the word line is deactivated, and as shown in FIG. 2A, this period corresponds to the times t1 to t3 under the fast condition. Under the slow condition, after the first process (for example the refresh operation) 311 ended, the second process (for example the read operation) 312 is performed. During the processes 311 and 312, the word line is deactivated, and as shown in FIG. 2A, this period corresponds to the times t1 to t7.

Figure 3B:
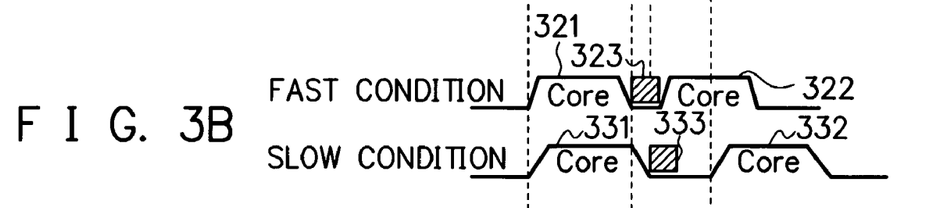

FIG. 3B corresponds to FIG. 2B, and shows a control method of deactivation periods of the word line of this embodiment. Under the fast condition, after the first process (for example the refresh operation) 321 ended, the second process (for example the read operation) 322 is performed. During the processes 321 and 322, the word line is deactivated, and as shown in FIG. 2B, the period corresponds to the times t1 to t4 under the fast condition. The delaying process 323 is performed during the times t1 to t4. Under the slow condition, after the first process (for example the refresh operation) 331 ended, the second process (for example the read operation) 332 is performed. During the processes of 331 and 332, the word line is deactivated, and as shown in FIG. 2B, the period corresponds to the times t1 to t6 under the slow condition. The delaying process 333 is performed during the times t1 to t5.

When the interval between the first process 301 and the second process 302 is too short under the fast condition in FIG. 3A, making the interval longer, the interval between the first process 311 and the second process 312 under the slow condition also becomes longer. In this embodiment, as shown in FIG. 3B, it is possible to make the interval between the first process 321 and the second process 322 longer under the fast condition, and at the same time the interval between the first process 331 and the second process 332 can be kept same under the slow condition.

Figure 3C:
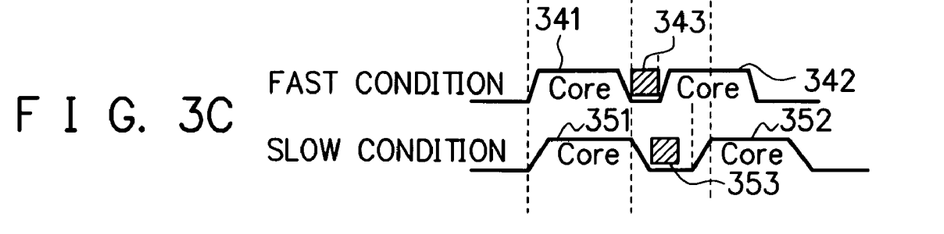

FIG. 3C corresponds to FIG. 2B, and shows another control method of deactivation periods of the word line in this embodiment. Under the fast condition, after the first process (for example the refresh operation) 341 ended, the second process (for example the read operation) 342 is performed. The delaying process 343 between the process 341 and 342 is performed during the times t1 to t4 under the fast condition in FIG. 2B. Under the slow condition, after the first process (for example the refresh operation) 351 ended, the second process (for example the read operation) 352 is performed. The delaying process 353 between the processes 351 and 352, is performed during the times t1 to t5 under the slow condition in FIG. 2B.

When the interval between the first process 311 and the second process 312 is too long under the slow condition in FIG. 3A, making the interval shorter, the interval between the first process 301 and the second process 302 under the fast condition also becomes shorter, and goes out of the specified value. In this embodiment, as shown in FIG. 3C, it is possible to make the interval between the first process 351 and the second process 352 shorter under the slow condition, and at the same time the interval between the first process 341 and the second process 342 can be kept same as or the longer under the fast condition.

In a semiconductor memory device, it is required to process an address conversion, make a judge whether a redundant function is used or not when a defective memory cell exists, and so on during the period from the deactivation to the next activation of a word line. So the period from the deactivation to the next activation of the word line should not be too short. In other words, it is required not to set the interval between the first process and the second process too short. However, if it is allowed too much time, it can be a restriction on a short cycle operation, or be a cause of a delay of a data output. Therefore, in order to perform a fast and steady operation, it is necessary to control the period not to decrease the speed under the slow condition in which the operation goes slow, and not to set the timing too narrow under the fast condition in which the operation goes fast.

Figure 4:
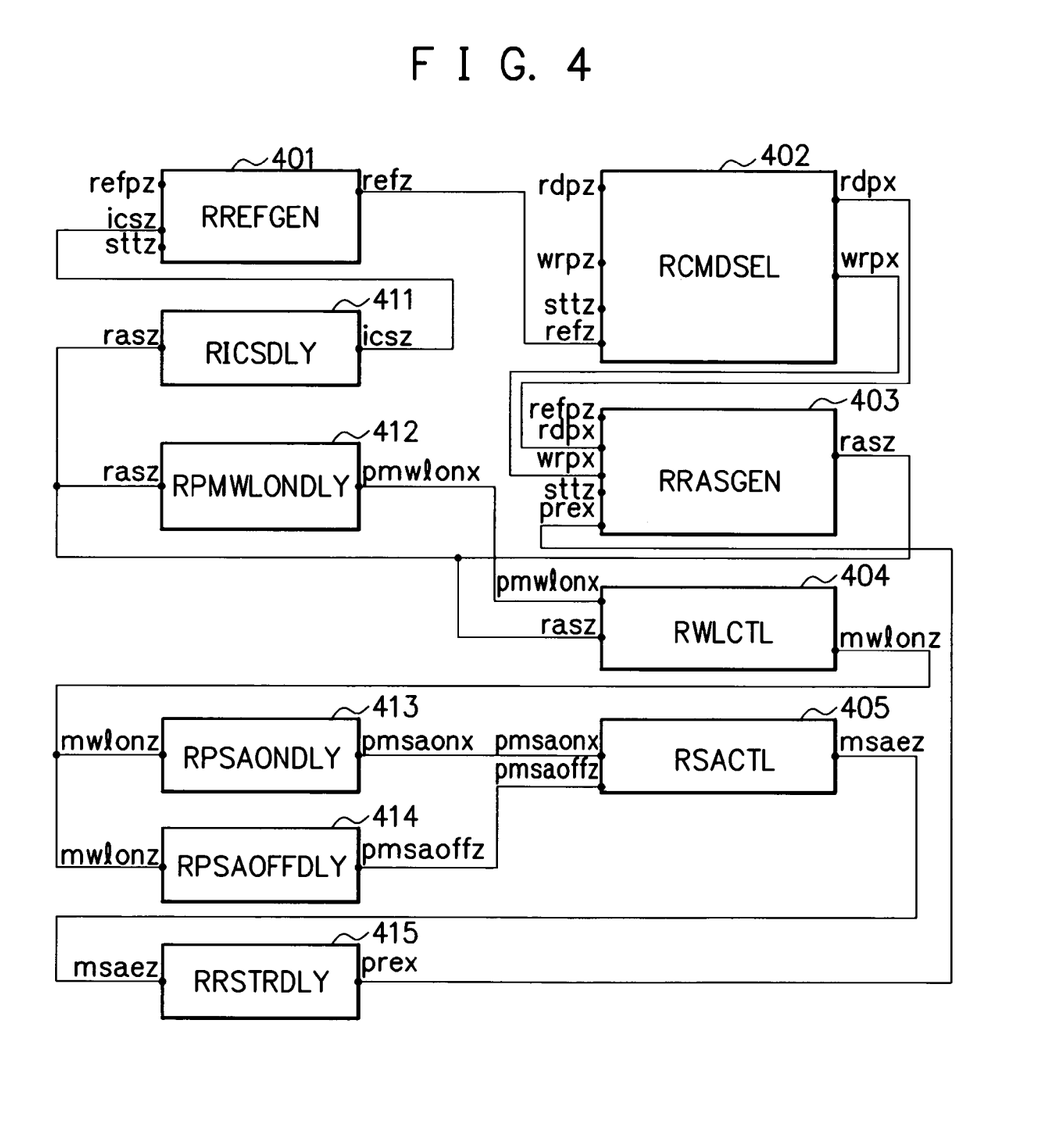
FIG. 4 is a block diagram which shows a configuration of a timing controller as an example.
Figure 5:
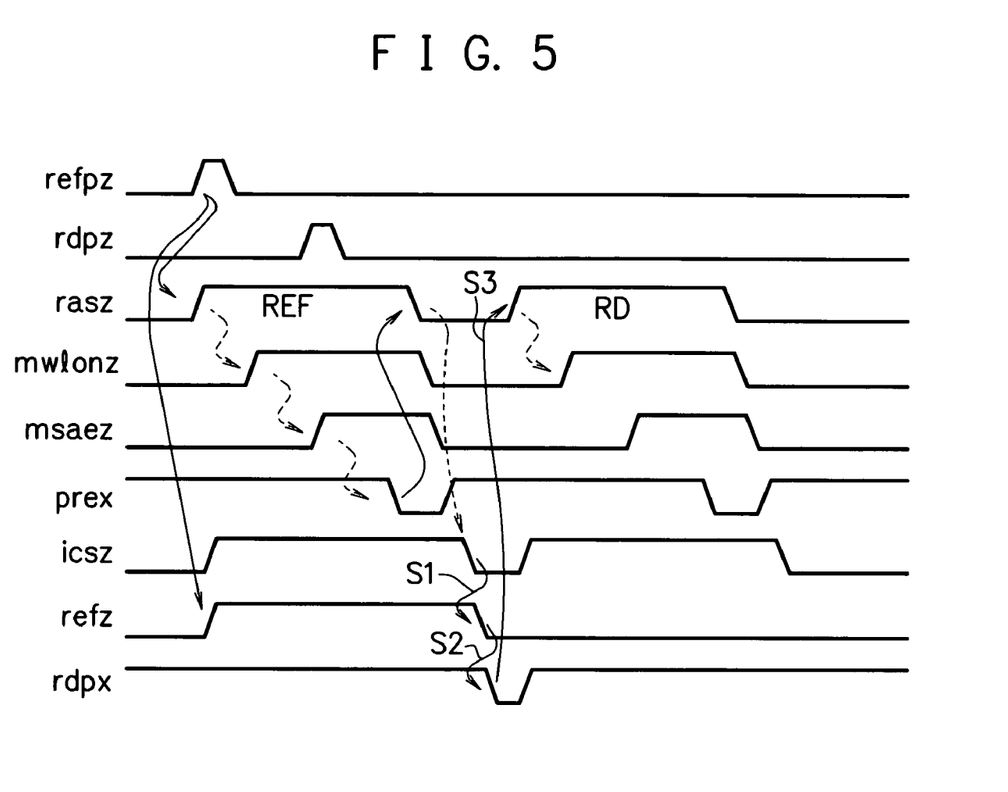
FIG. 5 is a timing chart which describes operations of circuits in FIG. 4.

FIG. 4 is a block diagram which shows a configuration of the timing controller 107 in FIG. 1 as an example, and FIG. 5 is a timing chart which describes its operation. This example corresponds to FIG. 2A and FIG. 3A. Circuits 401 to 405 are the logic circuits and circuits 411 to 415 are the delay circuits.

A RREFGEN circuit 401 inputs the refresh command refpz, a power on reset sttz, and a signal icsz, and outputs a refresh signal refz. The power-on reset sttz becomes high level at the time of power-on, and when it becomes high level, the refresh signal refz does not become high level. The signal icsz is a delayed signal of a signal rasz which is described later, by a RICSDLY circuit 411. The signal icsz becomes high level during reading or writing, and the refresh signal refz does not become high level.

A RCMDSEL circuit 402 inputs the refresh signal refz, the read command rdpz, the write command wrpz, and the power-on reset sttz, and outputs a read signal rdpx and a write signal wrpx. When the read command rdpz is inputted, the read signal rdpx will be activated, and when the write command wrpz is inputted, the write signal wrpx will be activated. However, when the refresh signal refz is in a high level or the power-on reset sttz is in a high level, the read signal rdpx and the write signal wrpx will not be activated and the read command rdpz or the write command wrpz will be kept inside by a flip flop.

A RRASGEN circuit 403 inputs the refresh command refpz, the read signal rdpx, the write signal wrpx, the power-on reset sttz, and a signal prex, and outputs the core operation signal rasz. The core operation signal rasz becomes high level when the refresh command refpz, the read signal rdpx or the write signal wrpx is activated.

A RICSDLY circuit 411 delays the core operation signal rasz and outputs the signal icsz. A RPMWLONDLY circuit 412 delays the core operation signal rasz and outputs a signal pmwlonx. A RWLCTL circuit 404 inputs the signal pmwlonx and the signal rasz, and outputs a word line selection signal mwlonz.

A RPSAONDLY circuit 413 delays the word line selection signal mwlonz and outputs a sense amp activation signal pmsaonx. A RPSAOFFDLY circuit 414 delays the word line selection signal mwlonz and outputs a sense amp deactivation signal pmsaoffz. A RSACTL circuit 405 inputs the signal pmsaonx and the signal pmsaoffz, and outputs the sense amp activation signal msaez.

A RRSTRDLY circuit 415 delays the sense amp activation signal msaez and outputs the signal prex. The sense amp activation signal msaez becomes high level, and when the predetermined time has passed after the core operation, the signal prex becomes low level and the core operation signal rasz becomes low level.

FIG. 5 shows an example of the case when the refresh command refpz is inputted and the read command rdpz is inputted continuously, the read operation is queued until the refresh operation ends. Solid line arrows show the processes of the logic circuits 401 to 405, and dotted line arrows show the processes of the delay circuits 411 to 415.

When the refresh command refpz is started up, the refresh signal refz is started up by the logic circuit 401, the signal rasz is started up by the logic circuit 403, and the refresh operation will start. While the refresh signal refz is in a high level, the read operation will be queued even if the read command rdpz is inputted.

The start up of the signal rasz is delayed by the delay circuit 412 and the signal mwlonz is started up. The start up of the signal mwlonz is delayed by the delay circuit 413 and the signal masez is started up. By the delay circuit 415, the start up of the signal msaez is delayed, made logical inversion, and becomes the signal prex.

When the signal prex is started down, the signal rasz is started down by the logic circuit 403. The start down of the signal rasz is delayed by the delay circuit 411 and the signal icsz is started down. When the signal icsz is started down, the refresh signal refz is started down by the process S1 of the logic circuit 401. When the refresh signal refz is started down, the read signal rdpx is started down by the process S2 of the logic circuit 402 because the generated read command rdpz is kept. When the read signal rdpx is started down, the signal rasz is started up by the process S3 of the logic circuit 403, and the read operation is started. The start up of the signal rasz is delayed by the delay circuit 412 and the signal mwlonz is started up.

As described above, this example corresponds to FIG. 2A and FIG. 3A, and followed by the processes S1, S2 and S3 of the logic circuits ended after the delaying process of the delay circuits, the next processes start. Along with each condition, dispersions of the logical operation processes S1, S2, and S3 are large.

When the read operation is performed after the refresh operation, the signal prex becomes low level at the time when "refresh" ends, and a pre-charge operation of the bit line starts. When the signal prex becomes low level, the flip flop is reset in the RRASGEN circuit 403, and the signal rasz becomes low level, then the signal mwlonz is made to become low level in the RWLCTL circuit 404 and the word line is deactivated. At the same time, the signal rasz becomes low level, and the timing adjustment is performed in the RICSDLY circuit 411 and then the refresh signal refz is released in the RREFGEN circuit 401.

In the RCMDSEL circuit 402, when the read status is latched to the flip flop status, the pulse which shows the signal rdpx is in a low level is outputted, responding to the signal refz is in a low level and "refresh" has ended. By the low level pulse of the signal rdpx, the flip flop is set in the RRASGEN circuit 403, and the signal rasz becomes high level, then the signal mwlonz becomes high level in the RWLCTL circuit 404, and the word line is activated again.

As can be seen in this example, during the period from the deactivation to the activation of the word line, the delay circuits of the RICSDLY circuit 411 and the RPMWLONDLY circuit 412, and the logic circuits of the RREFGEN circuit 401, the RCMDSEL circuit 402, and the RRASGEN circuit 403 are passed through. So, the elapsed time until the re-activation of the word line is largely affected by the dispersions of the processing time of the latter three logic circuits.

Figure 6:
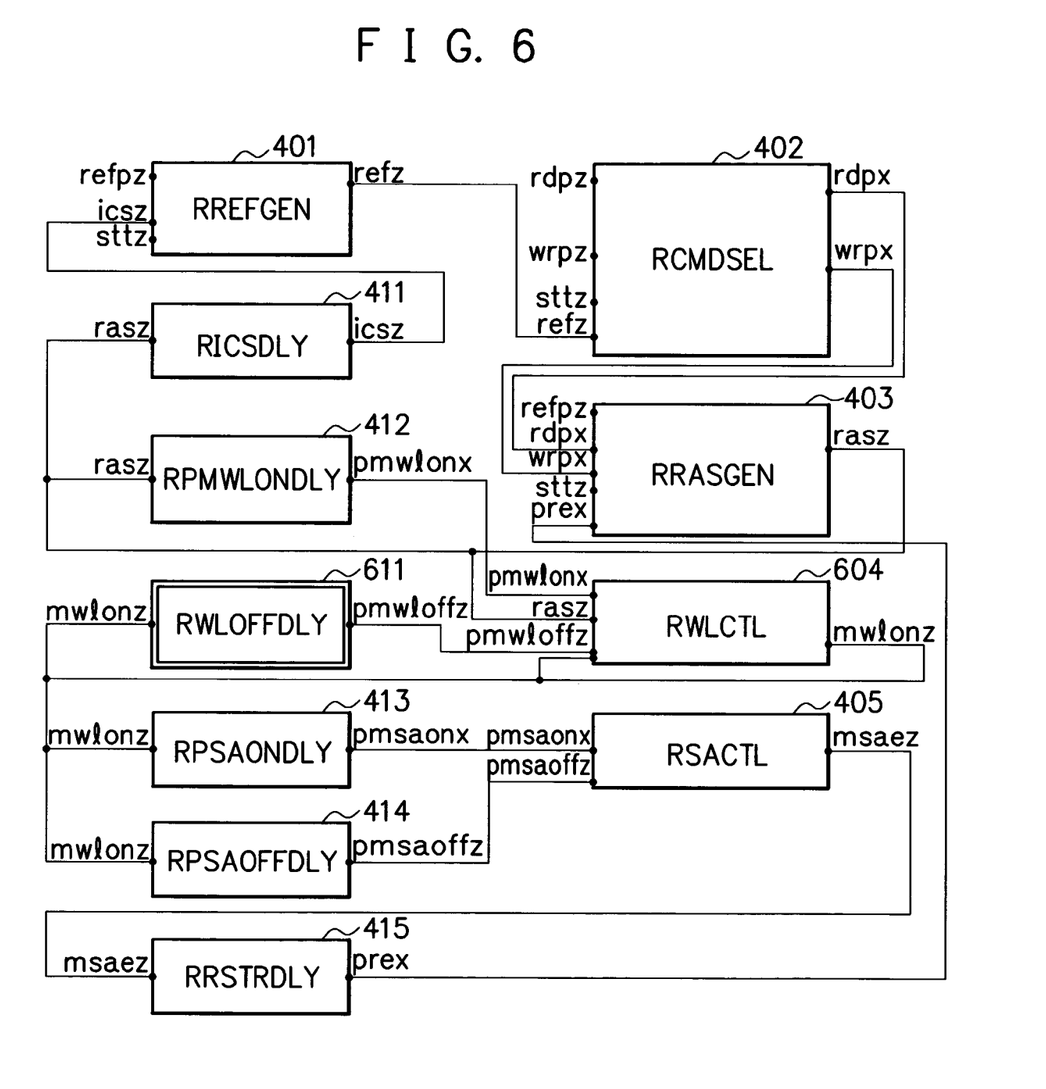
FIG. 6 is a block diagram which shows a configuration example of the timing controller of the first embodiment.
Figure 7:
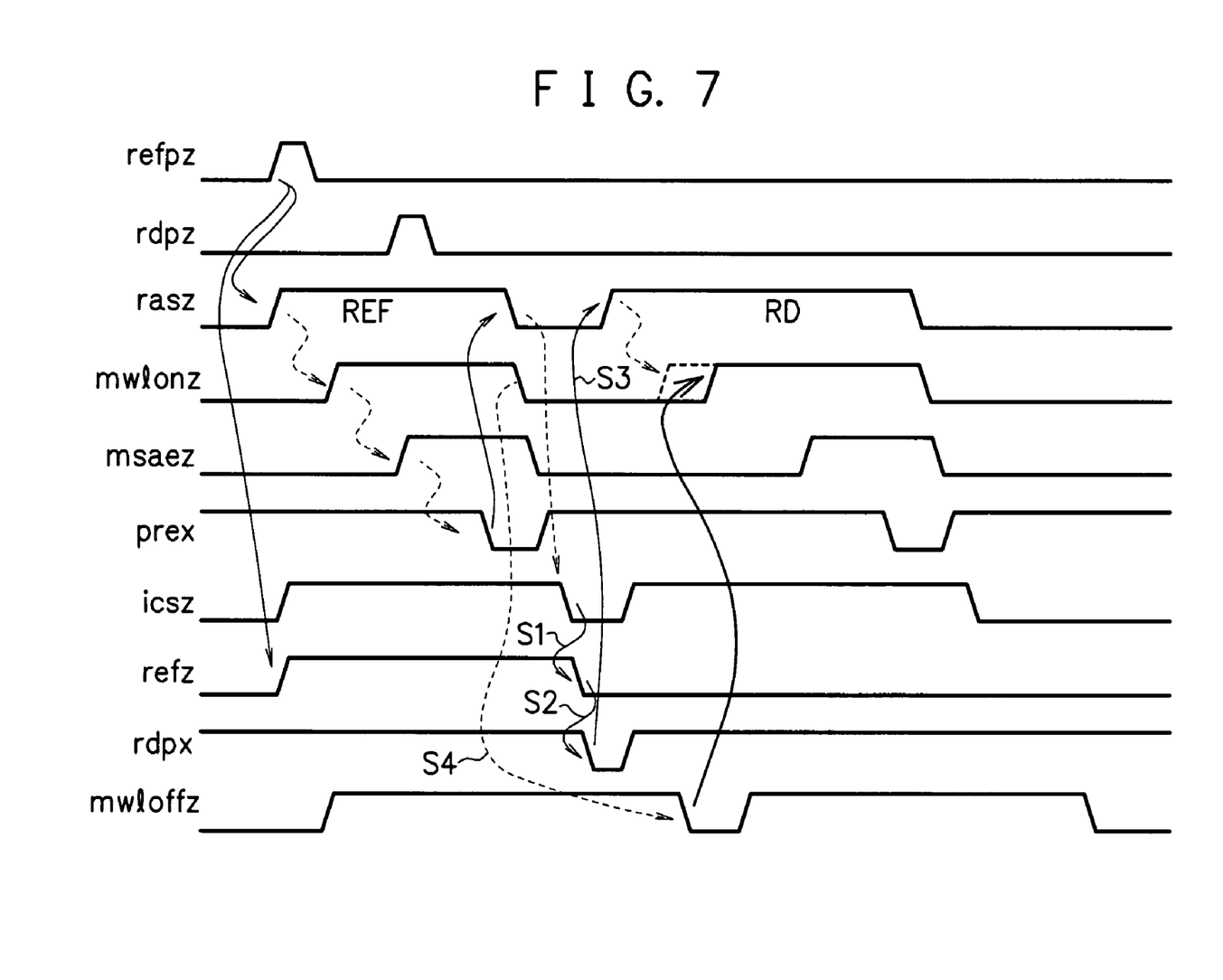
FIG. 7 is a timing chart which describes operations of circuits in FIG. 6 under a fast condition.
Figure 8:
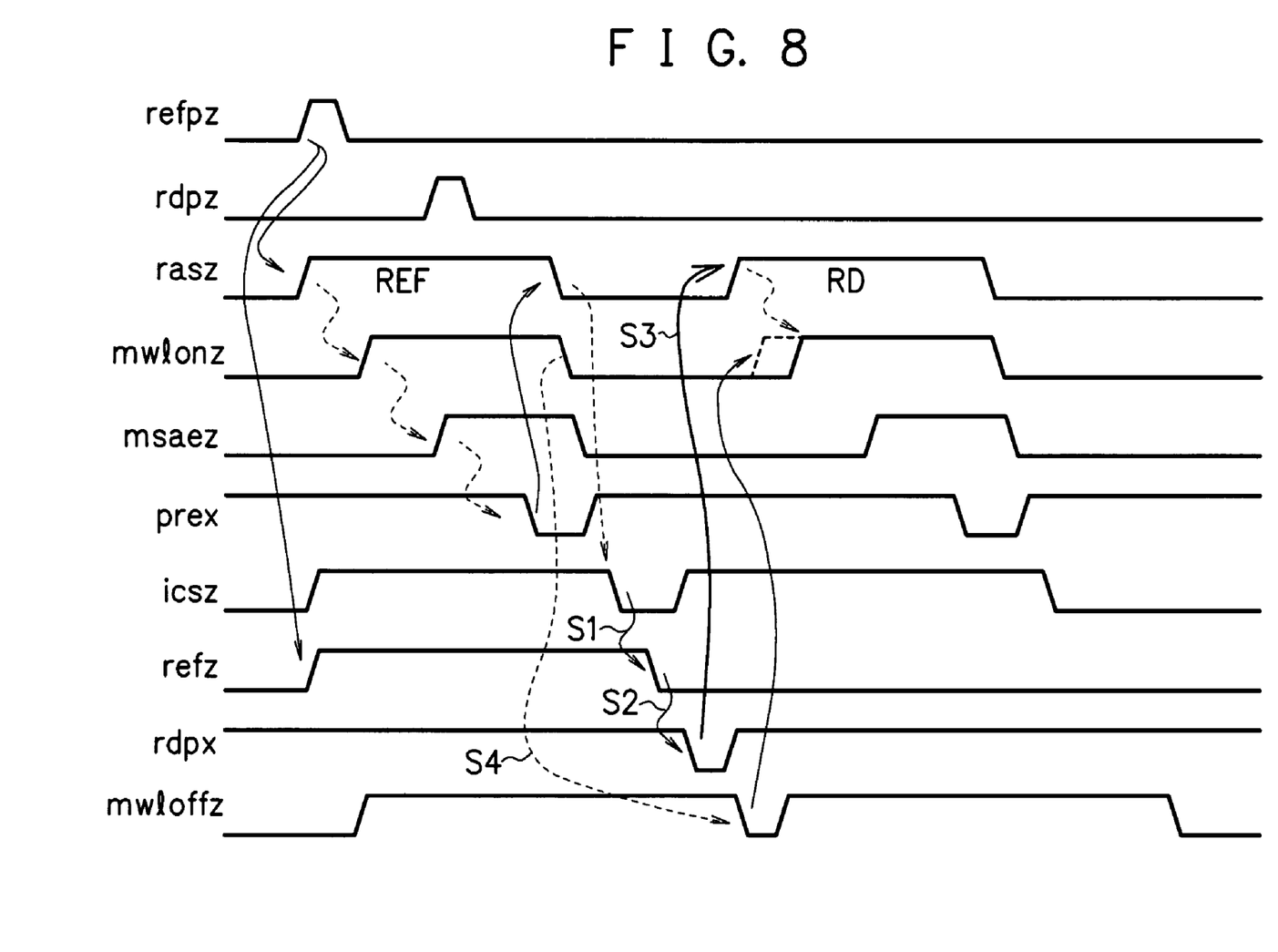
FIG. 8 is a timing chart which describes operations of circuits in FIG. 6 under a slow condition.

FIG. 6 is a block diagram which shows a configuration example of the timing controller 107 in FIG. 1 of this embodiment, and FIG. 7 and FIG. 8 are timing charts which describe its operation. FIG. 7 is the timing chart under the fast condition, and FIG. 8 is the timing chart under the slow condition. This embodiment corresponds to FIG. 2B, FIG. 3B, and FIG. 3C. Only the different points between the circuits in FIG. 6 and the circuits in FIG. 4 are will be described below. A delay circuit 611 is added. A logic circuit 604 is set in stead of the circuit 404. Other components in FIG. 6 are the same as those in FIG. 4. The RWLOFFDLY circuit 611 delays the start down of the signal mwlonz, makes logical inversion, and outputs a signal pmwloffz. The RWLCTL circuit 604 inputs the signals pmwlonx, rasz, pmwloffz, and mwlonz, and outputs the signal mwlonz.

FIG. 7 is the timing chart of the circuits in FIG. 6 under the fast condition. The different point from the timing chart in FIG. 5 is described below. Even if the signal rasz is started up by the logical operation processes S1 to S3, the logic circuit 604 retains the signal mwlonz in a low level because the signal mwloffz is in a high level. These logical operation processes S1 to S3 correspond to the logical operation process Logic (times t1 to t2) under the fast condition in FIG. 2B.

On one hand, the delay circuit 611 delays the start down of the signal mwlonz, makes logical inversion, and outputs the signal mwloffz. That is to say, when the signal mwlonz is started down, the signal is delayed by a process S4 of the delay circuit 611, and the signal mwloffz is started down. This delaying process S4 corresponds to the delaying process Delay (times t1 to t4) under the fast condition in FIG. 2B. After that, as a next process, the signal mwlonz is started up by the logic circuit 604.

As described above, corresponding to the fast condition in FIG. 2B, the processing time is determined by the delaying process S4, and can be prevented from being too early compared to the specified time.

FIG. 8 is the timing chart under the slow condition of the circuits in FIG. 6. The different point from the timing chart in FIG. 7 is described below. Even if the signal mwloffz is started down by the delaying process S4, the logic circuit 604 retains the signal mwlonz in a low level because the signal rasz is in a low level. This delaying process S4 corresponds to the delaying process Delay (times t1 to t5) under the slow condition in FIG. 2B.

When the signal rasz is started up by the logical operation processes S1 to S3, the logic circuit 604 starts up the signal mwlonz because the signal mwloffz is in a low level. These logical operation processes S1 to S3 correspond to the logical operation process Logic (times t1 to t6) under the slow condition in FIG. 2B.

As described above, corresponding to the slow condition in FIG. 2B, the processing time is determined by the logical operation processes S1 to S3, and can be prevented from being too late compared to the specified time.

In this embodiment, the delay circuit of the RWLOFFDLY circuit 611 is newly provided, and even under the condition when the processes in the RREFGEN circuit 401, the RCMDSEL circuit 402, and the RRASGEN circuit 403 end too early, the next activation process of the word line is queued until the output signal pmwloffz of the RWLOFFDLY circuit 611 becomes low level. Under the condition when the operation becomes slow, the delaying process of the RWLOFFDLY circuit 611 is designed to output the low level of the signal pmwloffz before the logical operation processes in the RREFGEN circuit 401, the RCMDSEL circuit 402, and the RRASGEN circuit 403 end, thus the operations are prevented from being late uselessly.

In FIG. 7, the following logical operation processes in the three circuits, the process S1 from the start down of the signal icsz until the start down of the signal refz, the process S2 from the start down of the signal refz until the start down of the signal rdpx, and the process S3 from the start down of the signal rdpx until the start up of the signal rasz, are processed in the back of the timing measurement process S4 from the start down of the signal mwlonz until the start down of the signal mwloffz. So, even if the timing when the signal rasz becomes high level is early, the period when the signal mwlonz is in a low level can be prevented from being short. Therefore, the steady control of word lines can be achieved without making the latest processing time worse.

Besides, during the period of the activation of the word line, the logical operation processes in the two circuits are performed between the processes in the RWLCTL circuit 604, as in the following order, the RWLCTL circuit 604, the RSACTL circuit 405, the RRASGEN circuit 403, and the RWLCTL circuit 604. In parallel with these processes, it is possible to control dispersions of the activation period of the word line, by setting the delay circuit 611 for the purpose of timing control between the process in the RWLCTL circuit 604 and the process of the RWLCTL circuit 604.

The logic circuit 403 and so on, perform the logical operation processes and outputs the first signal rasz. The delay circuit 611 delays the input signal mwlonz and outputs the second signal pmwloffz, in parallel with the logical operation process in the logic circuit 403 and so on. The processing circuit 604 inputs the above stated first signal rasz and the above stated second signal pmwloffz, and starts the start up process of the signal mwlonz, after both the above stated first signal rasz and the above stated second signal pmwloffz are outputted. Under the fast condition in FIG. 7, the above stated first signal rasz is outputted earlier than the above stated second signal pmwloffz, and under the slow condition in FIG. 8, the above stated second signal pmwloffz is outputted earlier than the above stated first signal rasz.

The delay circuit has smaller dispersion of the processing time depending on conditions compared to the logic circuit. Therefore, under the fast condition, the first signal is outputted earlier than the second signal, so the processing circuit starts the process at the output timing of the second signal from the delay circuit, and the start timing of the process can be prevented from being too early compared to the specified value. And, under the slow condition, the second signal is outputted earlier than the first signal, so the processing circuit starts the process at the output timing of the first signal from the logic circuit, and the start timing of the process can be as early as possible.

Second Embodiment

Figure 9:
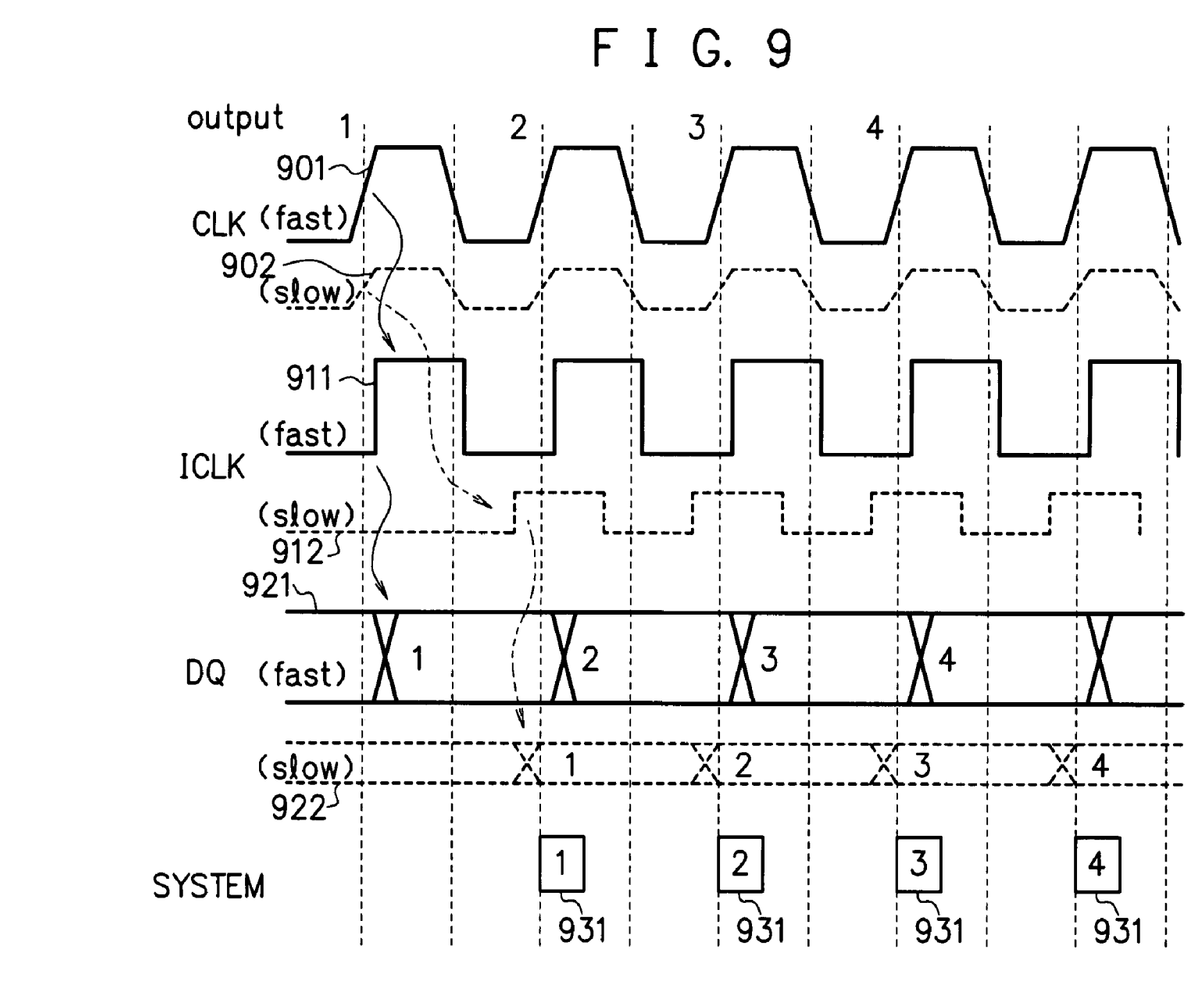
FIG. 9 is a timing chart which describes operations of circuits in FIG. 11.
Figure 11:
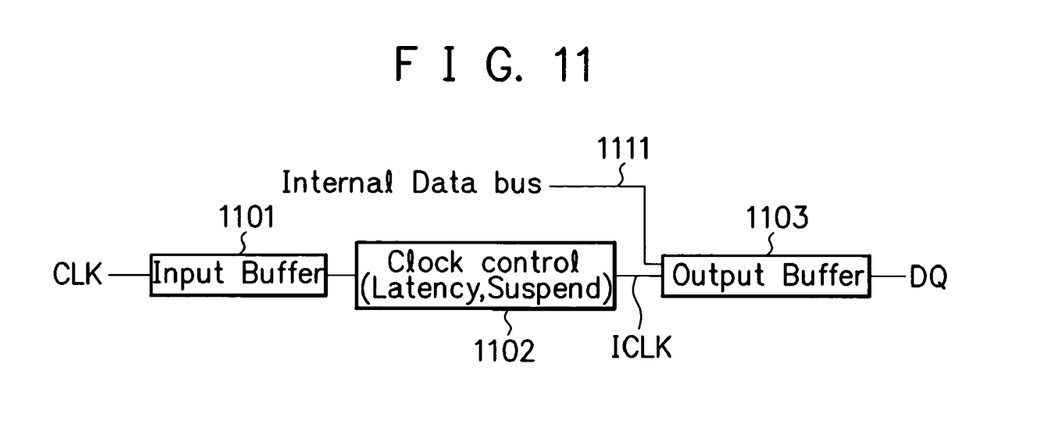
FIG. 11 is a block diagram which shows a partial configuration of a data I/O circuit as an example.

FIG. 11 is a block diagram which shows a partial configuration of the data I/O circuit 110 in FIG. 1 as an example, and FIG. 9 is a timing chart which describes its operation. A data output of a synchronous semiconductor memory device is shown here, and it corresponds to FIG. 2A and FIG. 3A. An external clock CLK is supplied to a clock control circuit (the logic circuit) 1102 through an input buffer circuit 1101. The input buffer circuit 1101 detects the clock CLK. The clock control circuit 1102 inputs the clock CLK, performs the logical operation processes of a count operation of latency and a suspend operation (stop the transmission of the clock temporary) and so on, and outputs an internal clock ICLK. An output buffer 1103 synchronizes to the internal clock ICLK, and outputs a data 1111 of an internal data bus which is read out of a memory cell, as a data DQ. Here, the clock control circuit 1102 is the logic circuit and has large dispersion of the processing time because it is designed for logical operation processes.

In FIG. 9, as the external clock CLK, the clock is divided into a clock 901 under the fast condition, and a clock 902 under the slow condition. These amplitudes are different influenced by for example a power-supply voltage. As the internal clock ICLK, the clock is divided into a clock 911 under the fast condition, and a clock 912 under the slow condition. The internal clock ICLK has a large dispersion of the processing time depending on conditions by the logical operation process of the clock control circuit (the logic circuit) 1102. Thereby, the clock 912 under the slow condition has a longer delaying time than the clock 911 under the fast condition. As the data DQ, the data is divided into a data 921 under the fast condition, and a data 922 under the slow condition. The data 921, under the fast condition, synchronizes to the clock 911, and it is outputted early. The data 922, under the slow condition, synchronizes to the clock 912, and it is outputted later.

A data window 931 is a specified value of a time frame in which data DQ can be extracted from external systems. If data are extracted in this window, the reliability of the data should be certified. As for the data 922 under the slow condition, reliable data are maintained in the data windows 931. On the contrary, as for the data 921 under the fast condition, data are altered in the data windows 931, and reliable data cannot be outputted. In other words, the delaying time of the clock 911 is too short under the fast condition, and the data 921 is outputted too early.

When the read operation is performed in the semiconductor memory device, it is necessary to control the output so that the data DQ is contained in the data window 931 of a system side. It is necessary to keep attention not only to be too late but also to prevent from crashing a precedent read data caused by the too early timing of data output for the next operation. For this reason, in controlling the output timing, it is required to control dispersions, and according to the speeding up of systems, it is also required for the read operation under the slow condition in which the operation of the semiconductor memory device becomes slow, not to become slow uselessly. This can be achieved by the timing control in the delay circuit of the read operation under the fast condition in which the operation of the semiconductor memory device becomes fast, not to become too fast.

A particular example will be considered with a semiconductor memory device which starts the data output 1 clock before the usage of data in a system. The data output from the semiconductor memory device under the slow condition in which operation becomes slow, is just in time for the reception of data in the system. At this moment, thinking about the case when the data output from the semiconductor memory device under the fast condition in which the operation becomes fast, is too early, and the next data is outputted from the semiconductor memory device during the period when the system is receiving data. When a clock frequency becomes high, these problems become more pronounced. However if the output is simply delayed to prevent malfunction of the system caused by the too early output of the next data, the data output from the semiconductor memory device under the slow condition in which the operation becomes slow, cannot be in time.

Figure 10:
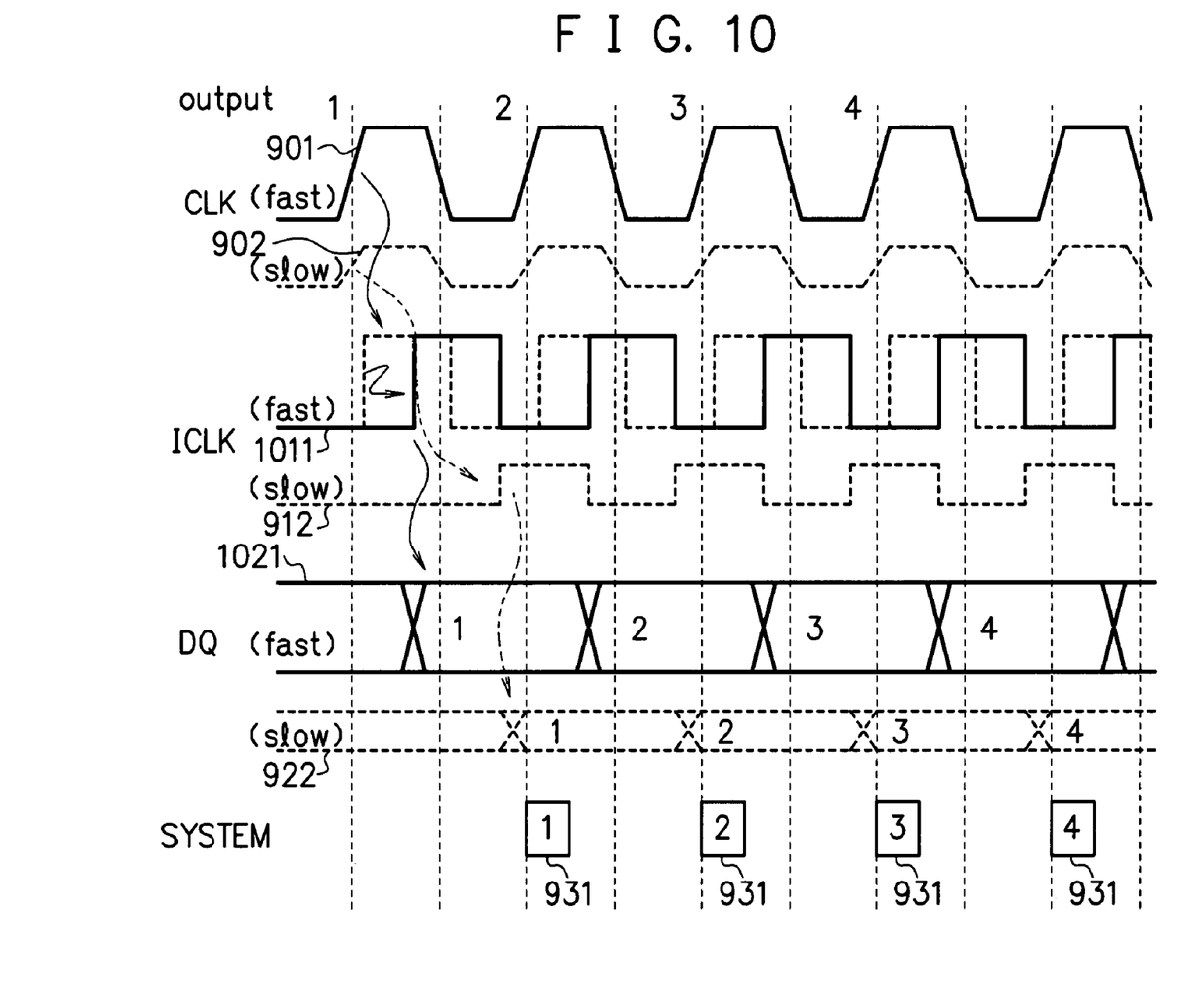
FIG. 10 is a timing chart which describes operations of circuits in FIG. 12.
Figure 12:
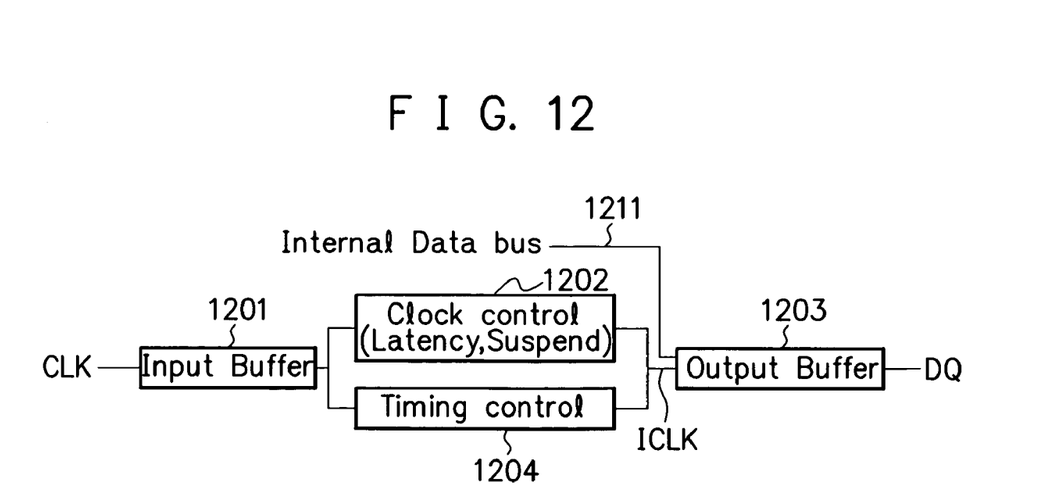
FIG. 12 is a block diagram which shows a partial configuration example of the data I/O circuit of a second embodiment according to the present invention.

FIG. 12 is a block diagram which shows a partial configuration example of the data I/O circuit 110 of the second embodiment according to the present invention, and FIG. 10 is a timing chart which describes its operation. A data output of a synchronous semiconductor memory device is shown here, and it corresponds to FIG. 2B, FIG. 3B, and FIG. 3C. An external clock CLK is supplied to a clock control circuit (the logic circuit) 1202 and a timing control circuit (the delay circuit) 1204 through an input buffer circuit 1201. The input buffer circuit 1201 detects a clock CLK. The clock control circuit 1202 inputs the clock CLK, performs the logical operation processes of a count operation of a latency and a suspend operation (stop the transmission of the clock temporary) and so on, and outputs an internal clock ICLK. The timing control circuit 1204 delays the clock CLK and outputs the internal clock ICLK. An output buffer 1203 synchronizes when internal clocks ICLK are outputted from both the clock control circuit 1202 and the timing control circuit 1204, and outputs a data of an internal data bus 1211 which is read out of a memory cell, as a data DQ.

In the present embodiment, the timing control circuit 1204 which performs the timing control is provided in parallel with the logical operation process of the clock control circuit 1202. The timing control circuit 1204 is designed to suppress dispersions of time measurement. So, it is possible to suppress the earliest processing time until the output of the data DQ to be too early without delaying the latest processing time.

In the timing chart of FIG. 10, the different points from the timing chart of FIG. 9 will be described below. The internal clock ICLK is divided into a clock 1011 under the fast condition and a clock 912 under the slow condition. The clock 1011 under the fast condition is delayed by the timing control circuit 1204 and the delaying time is longer than that of FIG. 9. Therefore, a data 1021 under the fast condition is also delayed compared to that of FIG. 9. As a result, the data 1021 under the fast condition and the data 922 under the slow condition are maintained to be reliable data in the data windows 931 of the system.

As mentioned above, the delaying time of the internal clock ICLK is determined by the timing control circuit (the delay circuit) 1204 under the fast condition, and the delaying time of the internal clock ICLK is determined by the clock control circuit (the logic circuit) 1202 under the slow condition. Hereby, the occurrence of system malfunction caused by the output of the next data from the semiconductor memory device can be prevented, because the timing adjustment is possible to delay the operations under the fast condition without delaying the operations under the slow condition.

The logic circuit (the clock control circuit) 1202 performs the logical operation process and outputs the first clock signal ICLK. The delay circuit (the timing control circuit) 1204 delays the input clock signal CLK in parallel with the logical operation process of the logic circuit 1202, and outputs the second clock signal ICLK. The processing circuit (the output buffer circuit) 1203 inputs the above stated first clock signal ICLK and the above stated second clock signal ICLK, and starts the process of data output when both the above stated first clock signal ICLK and the above stated second clock signal ICLK are outputted. Under the fast condition, the above stated first clock signal ICLK is outputted earlier than the above stated second clock signal ICLK, and under the slow condition, the above stated second clock signal ICLK is outputted earlier than the above stated first clock signal ICLK.

It is possible to suppress dispersions of the processing time by separating the path for the logical operation process from the path for the timing control. Under the slow condition in which the processing speed becomes slow, the process will be completed at the required time for the logical operation process. And under the fast condition in which the processing speed becomes fast, the processing time is made longer by using the delay circuit. Hereby, the occurrence of malfunction caused by the too narrow timing between signals under the fast condition can be prevented without delaying the latest processing time.

By using the word line control of the semiconductor memory device, the switching time of word lines can be prevented from being too narrow without delaying the cycle time or the access. And in the data output of the semiconductor memory device, the hold feature of data can be improved without delaying the access.

The path for the logical operation process is composed of elements which give priority to the speeding up of the process than dispersions of the processing time. The delay circuit is composed of elements which give priority to the accuracy of time measurement than the speeding up of the process.

In the above mentioned embodiment, the logical process and the timing control run in parallel. If the logical operation process and the delaying process are connected parallel, the accuracy of the timing control becomes high because the influence of dispersions of the logical operation time is not included when the time measurement by the delaying process ended.

The delay circuit is created for the purpose to control dispersions, so the steady time measurement is possible. But if the procedure that "the timing should be determined at the delay circuit without fail" is followed, it may be a demerit from the point of view of the fast operation, because it causes a useless delay in the timing critical path. For example, in the semiconductor memory device, the time for data reading is a loss within the read operation. Thereby, under the condition in which it takes long time for the logical operation process, the required time for the logical operation process determines the processing time as a function. And under the condition in which the logical operation process will be completed within a short period of time, a time measurement of the delay circuit is performed as adjusting the timing between other signals in the delay circuit. Thereby, the processes of signals, in which time is not wasted and dispersions are suppressed, can be achieved. And also, the steady operation can be performed without delaying the operation.

The delay circuit has small dispersion of the processing time depending on conditions compared to the logic circuit. Under the fast condition, the first signal will be outputted earlier than the second signal, and the processing circuit will start the process at the timing when the second signal is outputted from the delay circuit, and therefore prevent the process from starting too early relative to the specified value. Besides, under the slow condition, the second signal will be outputted earlier than the first signal, so the processing circuit will start the process at the output timing of the first signal of the logic circuit. Thus the processing start timing can be set as early as possible.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device comprising:
    a logic circuit for performing a logical operation process and outputting a first signal;
    a delay circuit for delaying an input signal and outputting a second signal in parallel with the logical operation process of said logic circuit; and
    a processing circuit for inputting said first signal and said second signal, and starting a process when both said first signal and said second signal are outputted,
    wherein said first signal is outputted earlier than said second signal under a fast condition, and said second signal is outputted earlier than said first signal under a slow condition.

2. The semiconductor device according to claim 1, wherein said delay circuit has smaller dispersion of processing time depending on conditions compared to said logic circuit.

3. The semiconductor device according to claim 1, further comprising a memory cell to memorize data.

4. The semiconductor device according to claim 3, wherein said logic circuit outputs the first signal to perform a data access to said memory cell in accordance with a read command or a write command.

5. The semiconductor device according to claim 4, wherein said processing circuit instructs to start reading or writing to said memory cell when both said first signal and said second signal are outputted.

6. The semiconductor device according to claim 5, further comprising a refresh circuit to perform a refresh operation to said memory cell.

7. The semiconductor device according to claim 6, wherein said logic circuit outputs said first signal to refresh said memory cell in accordance with a refresh command.

8. The semiconductor device according to claim 7, wherein said processing circuit instructs to start refreshing to said memory cell when both said first signal and said second signal are outputted.

9. The semiconductor device according to claim 3, further comprising a refresh circuit to perform a refresh operation to said memory cell.

10. The semiconductor device according to claim 9, wherein said logic circuit outputs the first signal to perform the refresh operation to said memory cell in accordance with a refresh command.

11. The semiconductor device according to claim 10, wherein said processing circuit instructs to start refreshing to said memory cell when both said first signal and said second signal are outputted.

12. The semiconductor device according to claim 3, wherein said logic circuit and said delay circuit perform the logical operation and the delay operation to respective clock signals, and said processing circuit outputs a data out of a said memory cell when both said first signal and said second signal are outputted.

13. The semiconductor device according to claim 1, wherein said delay circuit has resistance or capacity, and said logic circuit has neither resistance nor capacity.

14. The semiconductor device according to claim 13, wherein said delay circuit and said logical circuit have transistors.

15. The semiconductor device according to claim 1, wherein said delay circuit has resistance and capacity, and said logic circuit has neither resistance nor capacity.

16. The semiconductor device according to claim 1, wherein said delay circuit has a transistor of which gate length is 0.2 µm or more, and said logic circuit has a transistor of which gate length is less than 0.2 µm.

17. The semiconductor device according to claim 16, wherein said delay circuit has a transistor of which gate length is 0.5 µm or more, and said logic circuit has a transistor of which gate length is less than 0.2 µm.

* * * * *